United States Patent
Hou et al.

(10) Patent No.: US 8,431,985 B2
(45) Date of Patent: Apr. 30, 2013

(54) LAYOUT AND PROCESS OF FORMING CONTACT PLUGS

(75) Inventors: Yung-Chin Hou, Taipei (TW);
Lee-Chung Lu, Taipei (TW);
Shyue-Shyh Lin, Hsin-Chu (TW);
Li-Chun Tien, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 224 days.

(21) Appl. No.: 12/852,274

(22) Filed: Aug. 6, 2010

(65) Prior Publication Data
US 2012/0032268 A1    Feb. 9, 2012

(51) Int. Cl.
*H01L 29/66* (2006.01)
(52) U.S. Cl.
USPC .............. 257/327; 257/368; 257/E27.06
(58) Field of Classification Search .............. 257/327, 257/368, E27.06
See application file for complete search history.

(56) References Cited

U.S. PATENT DOCUMENTS

| 6,818,932 | B2* | 11/2004 | Nii et al. ............... | 257/288 |
| 7,034,365 | B2 | 4/2006 | Park et al. | |
| 2005/0253133 | A1* | 11/2005 | King ....................... | 257/25 |
| 2009/0184350 | A1* | 7/2009 | Kodama et al. ........ | 257/296 |
| 2009/0221116 | A1* | 9/2009 | Hase ....................... | 438/218 |

FOREIGN PATENT DOCUMENTS

| CN | 101488502 A | 7/2009 |
| KR | 10-2004-0070503 | 8/2004 |
| KR | 10-2005-0060643 | 6/2005 |

* cited by examiner

*Primary Examiner* — Tan N Tran
(74) *Attorney, Agent, or Firm* — Slater & Matsil, L.L.P.

(57) ABSTRACT

A device includes a semiconductor substrate including an active region, a gate electrode directly over the active region, and a gate contact plug over and electrically coupled to the gate electrode. The gate contact plug includes at least a portion directly over, and vertically overlapping, the active region.

12 Claims, 6 Drawing Sheets

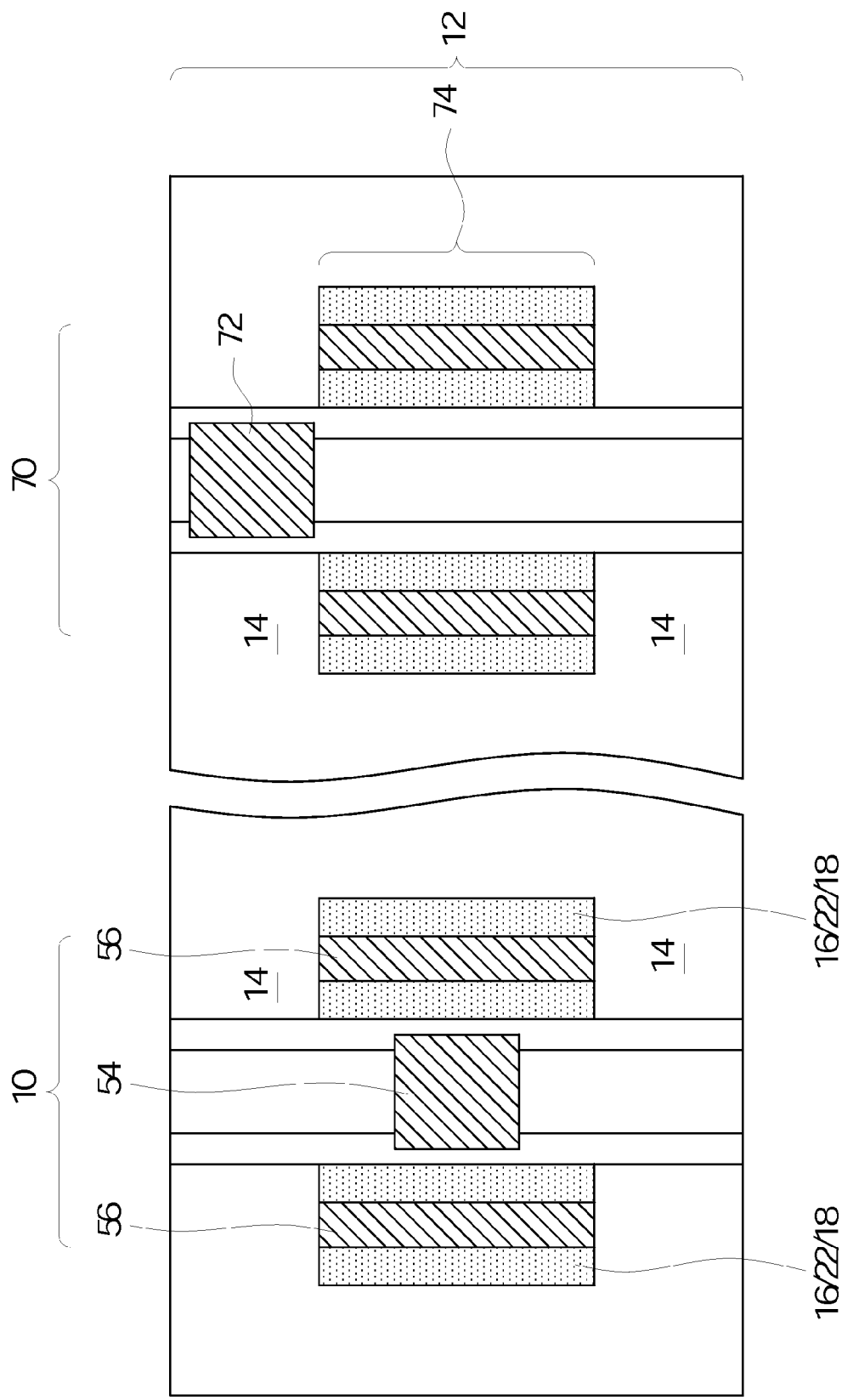

LAYOUT AND PROCESS OF FORMING CONTACT PLUGS

TECHNICAL FIELD

This disclosure relates generally to integrated circuit manufacturing processes, and more particularly to the formation of contact plugs for metal-oxide-semiconductor (MOS) devices.

BACKGROUND

Metal-oxide-semiconductor (MOS) devices are commonly known integrated circuit devices. A MOS device includes a source, a drain, and a gate, wherein the source and drain regions are formed in an active region, and the gate is formed directly over the active region, and is separated from the active region by a gate dielectric. A dielectric layer commonly known as inter-layer dielectric (ILD) is formed over the MOS device, and contact plugs are formed in the ILD and electrically connected to the source, drain, and gate. In conventional processes, gate contact plugs were formed outside the region directly over the respective active regions, and were formed directly over insulation regions adjoining the respective active regions.

SUMMARY

In accordance with one aspect, a device includes a semiconductor substrate including an active region, a gate electrode directly over the active region, and a gate contact plug over and electrically coupled to the gate electrode. The gate contact plug includes at least a portion directly over, and vertically overlapping, the active region.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel layout of a metal-oxide-semiconductor (MOS) device is provided in accordance with an embodiment. The intermediate stages of manufacturing various embodiments are illustrated. Throughout the various views and illustrative embodiments, like reference numbers are used to designate like elements.

Figure 1A:
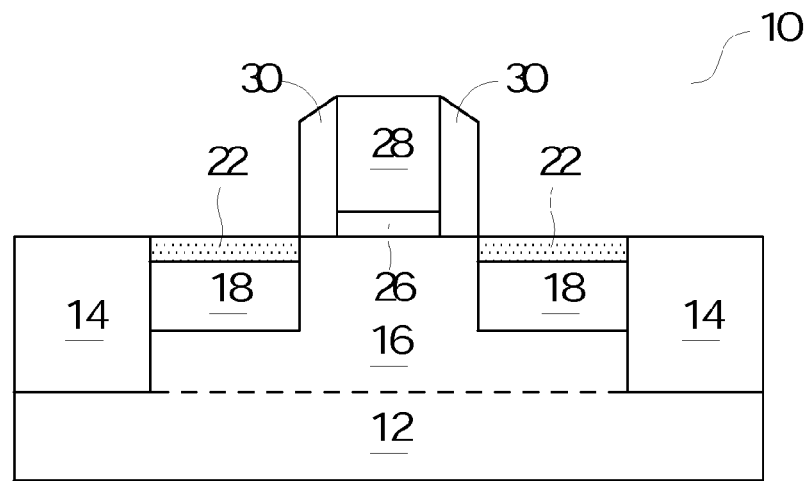
FIGS. 1A through 7D are cross-sectional views of intermediate stages in the manufacturing of a MOS device in accordance with an embodiment.
Figure 1B:
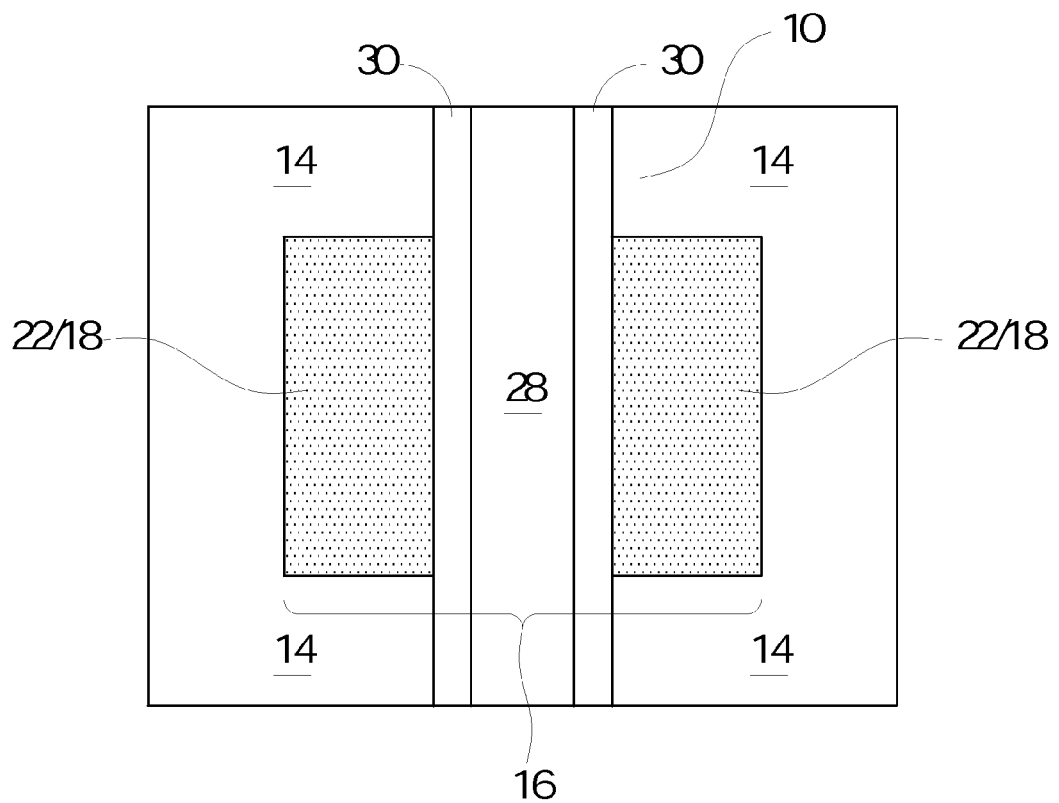

FIG. 1A illustrates a cross-sectional view and a top view, respectively, of an intermediate stage in the formation of a MOS device in accordance with an embodiment. A portion of MOS device 10 is formed at the surface of semiconductor substrate 12, which may be formed of commonly known semiconductor materials such as silicon, germanium, silicon germanium, gallium arsenic, and the like. Semiconductor substrate 12 may also be a bulk silicon substrate or a silicon-on-insulator (SOI) substrate. Insulation regions such as hallow trench isolation (STI) region(s) 14 may be formed in semiconductor substrate 12 and define active region 16 in semiconductor substrate 12. MOS device 10 further includes source and drain regions (referred to as source/drain regions hereinafter) 18, lightly doped source/drain (LDD) regions (not shown), and source/drain silicide regions 22. A dummy gate stack including gate dielectric 26 and dummy gate electrode 28 is formed over active region 16. As is known in the art, gate dielectric 26 may be formed of silicon oxide, silicon nitride, silicon oxy-nitride, and/or high-k dielectric materials. Dummy gate electrode 28 may be formed of polysilicon. Gate spacers 30 are formed on the sidewalls of the gate stack. The formation processes of the above-described components of MOS device 10 are known in the art, and hence are not discussed herein. The top view of the structure as shown in FIG. 1A is shown in FIG. 1B.

Figure 2:
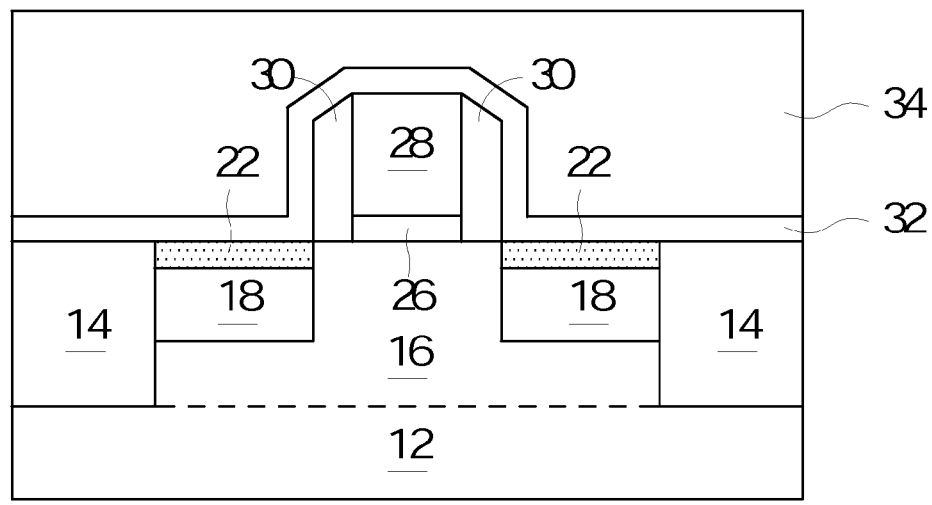

FIG. 2 illustrates the formation of contact etch stop layer (CESL) 32 and inter-layer dielectric (ILD) 34, which is alternatively referred to as ILD1 34 since it is a first layer of a composite ILD. CESL 32 may be formed of silicon oxide, silicon nitride, silicon oxynitride, or the like. ILD1 34 may be formed of boron-phospho silicate glass (BPSG), and/or other low-k dielectric materials, which may be carbon-based and/or Si-based materials. CESL 32 and ILD1 34 may be formed using plasma enhanced chemical vapor deposition (PECVD), spin-on, or the like.

Figure 3:
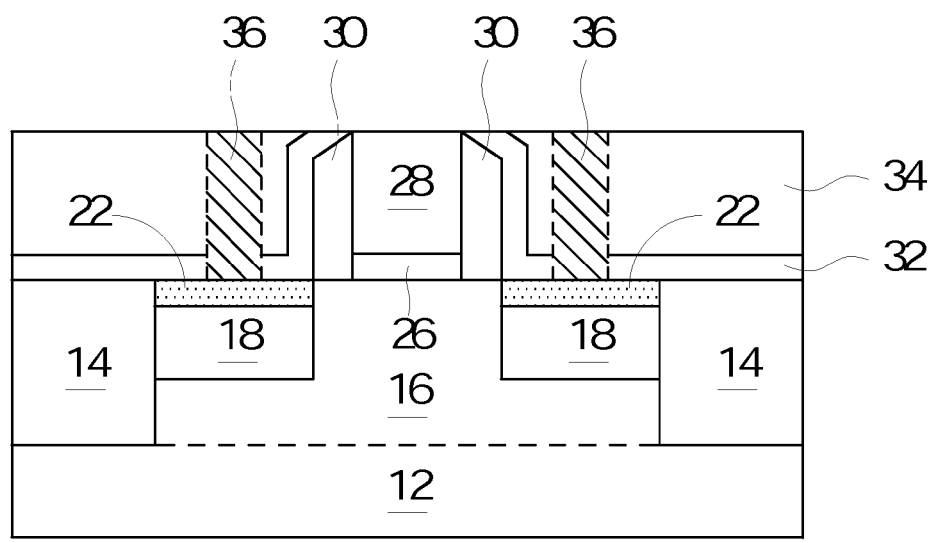

Next, as shown in FIG. 3, a chemical mechanical polish (CMP) or an etching step is performed to lower the top surface of ILD1 34, until dummy gate electrode 28 is exposed. Optionally, source and drain contact plugs 36 may be formed in ILD1 34 at this time and electrically coupled to source/drain silicide regions 22. Source and drain contact plugs 36 may be formed of tungsten or other metals. In alternative embodiments, source and drain contacts are formed after the formation of metal gate 42 as illustrated in FIG. 4.

Figure 4:
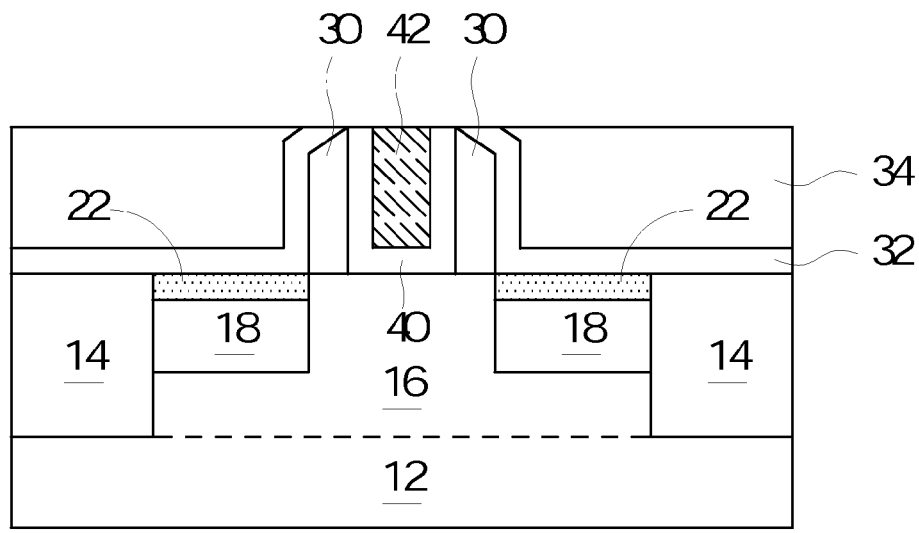

In FIG. 4, dummy gate electrode 28 and gate dielectric 26 are etched, and gate dielectric 40 and metal gate electrode 42 are formed. The formation process includes filling a gate dielectric layer and a metal gate layer, and performing a CMP to remove the excess portions of the gate dielectric layer and the metal gate layer, with the remaining portions of the gate dielectric layer and the metal gate layer being gate dielectric 40 and metal gate electrode 42, respectively. Alternatively, gate dielectric 26 is not removed, and is not replaced with gate dielectric 40. If the resulting MOS device 10 is a PMOS device, metal gate electrode 42 may be formed using metals with high work functions. If the resulting MOS device 10 is an NMOS device, metal gate electrode 42 may be formed using metals with low work functions. Gate dielectric 40 may be formed of a high-k dielectric material with a dielectric constant greater than 7, for example.

Figure 5:
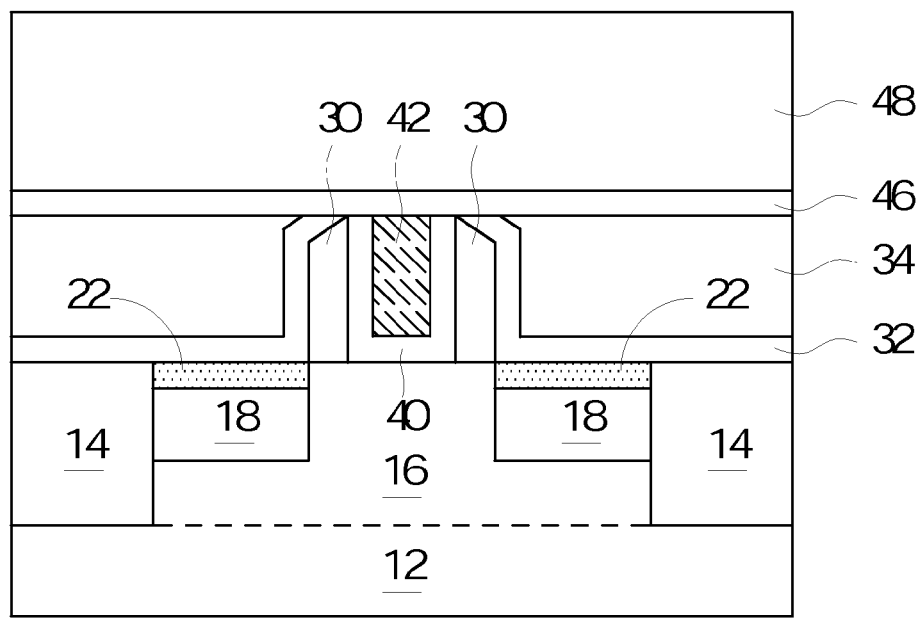
Figure 6:
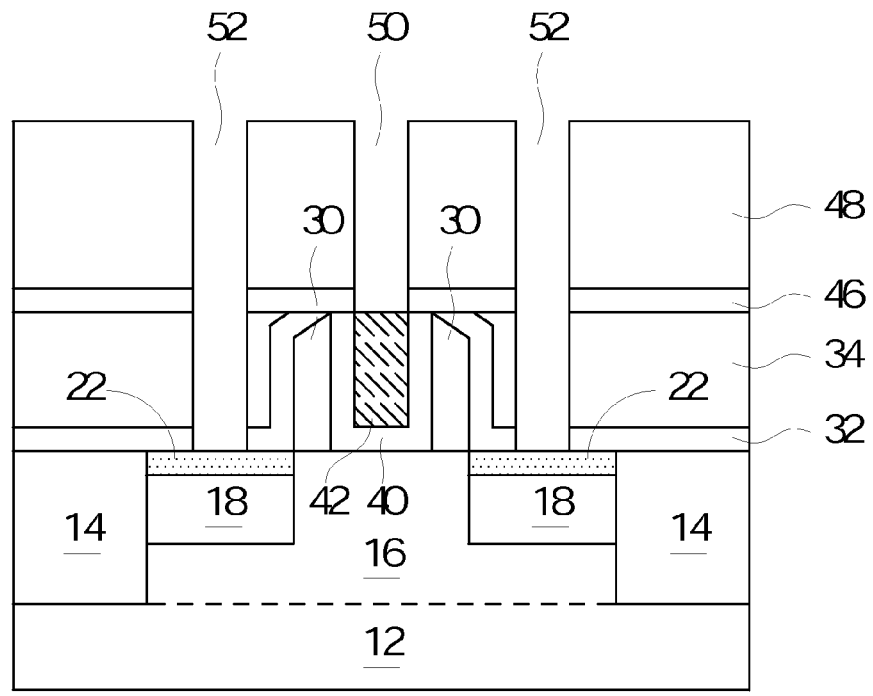

FIG. 5 illustrates the formation of CESL 46, which is an optional layer, and the formation of ILD2 48 on CESL 46. CESL 46 may be formed of materials the same or similar to that of CESL 32, and ILD2 48 may be formed of materials the same or similar to that of ILD1 34, although different materials may be used. Next, as shown in FIG. 6, gate contact opening 50 and source/drain contact openings 52 are formed. Through gate contact opening 50, metal gate electrode 42 is exposed. Through source/drain contact openings 52, source/drain silicide regions 22 are exposed. Alternatively, if contact plugs 36 as shown in FIG. 3 have already been formed, contact plugs 36 are exposed through source/drain contact openings 52. In the formation of gate contact opening 50 and source/drain contact openings 52, process is controlled, and etchants are selected, so that metal gate electrode 42 is not etched through, and gate contact opening 50 does not reach gate dielectric 40 and the underlying active region 16. It is noted that since metal gate electrode 42 is formed of metal(s), the etching of metal gate electrode 42 is slow, and it is relatively easy to control the process for forming contact openings 50 and 52.

Figure 7A:
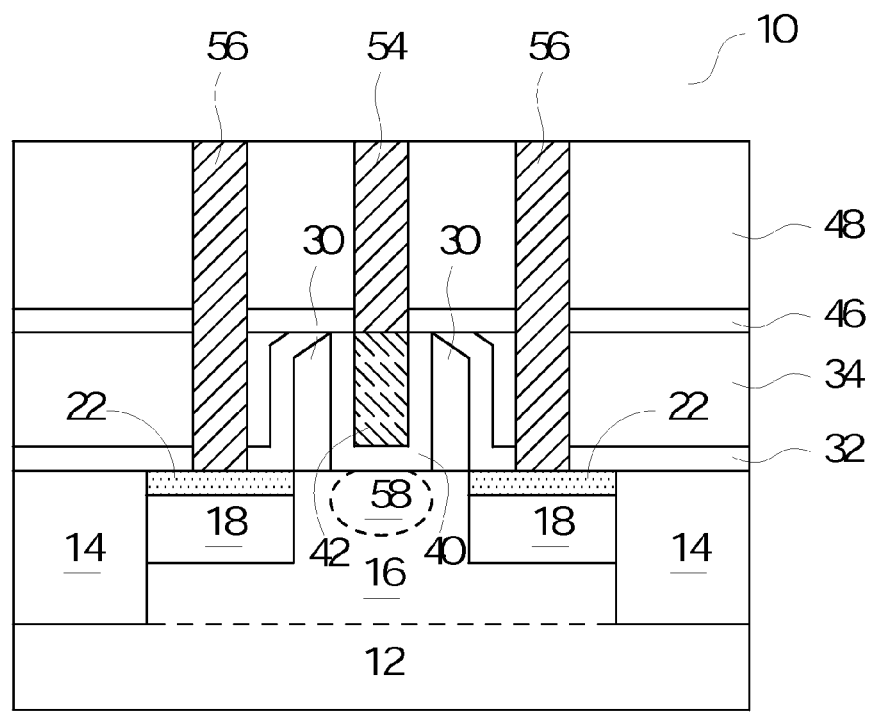

Next, as shown in FIG. 7A, gate contact opening 50 and source/drain contact openings 52 are filled with gate contact plug 54 and source/drain contact plugs 56, respectively. The filling process is known in the art, and hence is not discussed herein. Gate contact plug 54 and source/drain contact plugs 56 may be formed of tungsten or other known metals.

Figure 7B:
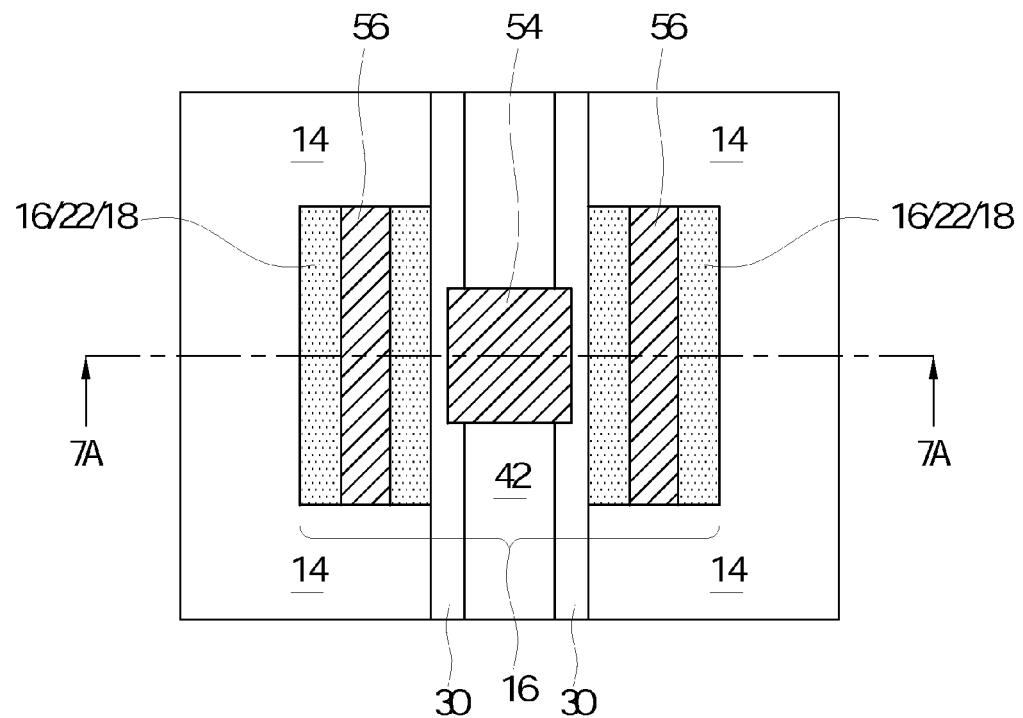
Figure 7C:
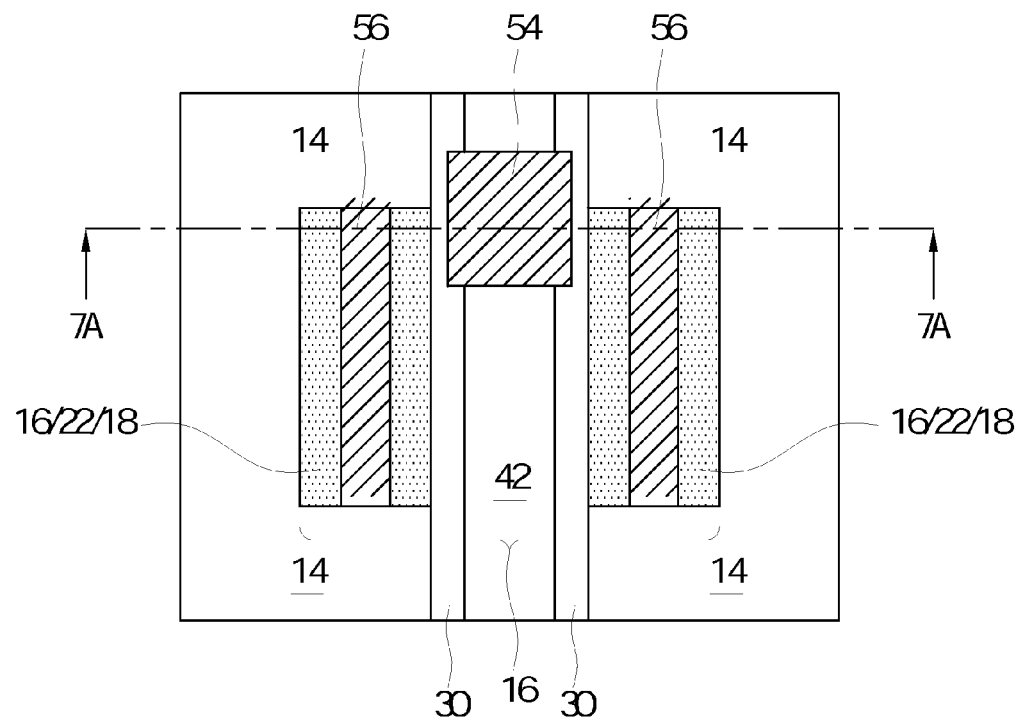

FIGS. 7B and 7C illustrate top views of the structure as shown in FIG. 7A, wherein FIG. 7A is obtained from the plane crossing line 7A-7A in FIG. 7B or 7C. It is observed that in FIGS. 7B and 7C, at least a portion of gate contact plug 54 is in the region directly over active region 16. In other words, as shown in FIG. 7A, at least a portion of gate contact plug 54 is vertically aligned to, and overlapping, a portion of active region 16. Further, at least a portion of gate contact plug 54 is vertically aligned to, and overlapping, a portion of channel 58 (FIG. 7A) of MOS device 10. In FIG. 7B, an entirety of gate contact plug 54 is directly over active region 16. In FIG. 7C, a first portion of gate contact plug 54 is directly over active region 16, while a second portion of gate contact plug 54 is directly over STI region 14.

It is appreciated that at the same semiconductor substrate 12, other MOS devices may be formed, with gate contact plug being not directly over the respective active regions. For example, FIG. 7D illustrates an additional MOS device 70, whose entire gate contact plug 72 is directly over STI region 14, and not directly over active region 74 of MOS device 70.

In the embodiments discussed in preceding paragraphs, metal gate electrode 42 is formed using a gate-last approach, in which metal gate electrode 42 is formed (replacing dummy gate electrode 28, see FIGS. 3 and 4) after the formation of source/drain regions 18. In alternative embodiments, metal gate electrode 42 and the underlying gate dielectric may be formed using a gate-first approach, and formed before the formation of source/drain regions 18. In the gate-first approach, gate contact plug 54 and source/drain contact plugs 56 may still be formed essentially the same as shown in FIGS. 7A through 7D. One skilled in the art will be able to realize the formation process by applying the teaching of the present disclosure.

In the embodiments, with at least a portion, and possibly an entirety, of gate contact plug 54 being formed directly over active region 16, the placement of gate contact plug 54 may have more options as shown in FIGS. 7A through 7D. The routing of overlying metal lines is thus more flexible. Further, since gate contact plug 54 is directly over active region 16, it no longer occupies additional chip area beyond the chip area occupied by the respective active region, and the device size may be reduced.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a semiconductor substrate comprising an active region;
   a gate electrode directly over the active region;
   a gate contact plug over and electrically coupled to the gate electrode, wherein the gate contact plug comprises at least a portion directly over, and vertically overlapping, the active region;
   an additional insulation region in the semiconductor substrate; and
   an additional MOS device comprising:
      an additional active region in the semiconductor substrate and adjoining the additional insulation region;
      an additional gate electrode directly over the additional active region; and
      an additional gate contact plug electrically coupled to the additional gate electrode, wherein an entirety of the additional gate contact plug is directly over the additional insulation region.

2. The device of claim 1, wherein the gate electrode acts as a gate of a MOS device, and wherein the gate contact plug is directly over a channel region of the MOS device.

3. The device of claim 1, wherein an entirety of the gate contact plug is directly over the active region.

4. The device of claim 1, wherein a first portion of the gate contact plug is directly over the active region, and a second portion of the gate contact plug is directly over an insulation region in the semiconductor substrate.

5. The device of claim 1 further comprising an insulation region in the semiconductor substrate and adjoining the active region, wherein a first portion of the gate contact plug is directly over the active region, and a second portion of the gate contact plug is directly over the insulation region.

6. The device of claim 1, wherein the gate electrode is a metal electrode.

7. The device of claim 1 further comprising:
   a first inter-layer dielectric (ILD) having a top surface substantially level with a top surface of the gate electrode;
   a contact etch stop layer (CESL) over the first ILD; and
   a second ILD over the CESL, wherein the gate contact plug comprises an upper portion in the second ILD, and a lower portion in the CESL.

8. A device comprising:
   a semiconductor substrate comprising a first active region;
   a first shallow trench isolation (STI) region in the semiconductor substrate and adjoining the first active region;
   a first MOS device comprising:
      a first metal gate electrode directly over the first active region;
      a first source/drain region in the first active region and on a side of the first metal gate electrode; and
      a first gate contact plug over and electrically coupled to the first metal gate electrode, wherein the first gate contact plug comprises at least a portion directly over, and vertically overlapping, the first active region;

a second STI region in the semiconductor substrate; and
a second MOS device comprising:
- a second active region in the semiconductor substrate and adjoining the second STI region;
- a second metal gate electrode directly over the second active region; and
- a second gate contact plug electrically coupled to the second metal gate electrode, wherein an entirety of the second gate contact plug is directly over the second STI region.

9. The device of claim 8 further comprising:
a first contact etch stop layer (CESL) over the first source/drain region;
a first inter-layer dielectric (ILD) over the first CESL and having a top surface substantially level with a top surface of the first metal gate electrode;
a second CESL over and contacting the first ILD and the first CESL; and
a second ILD over and contacting the second CESL, wherein the first gate contact plug comprises an upper portion in the second ILD, and a lower portion in the second CESL.

10. The device of claim 8, wherein the first gate contact plug is directly over a channel region of the first MOS device.

11. The device of claim 8, wherein an entirety of the first gate contact plug is directly over the first active region.

12. The device of claim 8, wherein a first portion of the first gate contact plug is directly over, and vertically overlapping, the first active region, and a second portion of the first gate contact plug is directly over, and vertically overlapping, the first STI region.

\* \* \* \* \*